(12) United States Patent
Kaiser et al.

(10) Patent No.: US 6,292,414 B1
(45) Date of Patent: Sep. 18, 2001

(54) METHOD FOR REPAIRING DEFECTIVE MEMORY CELLS OF AN INTEGRATED SEMICONDUCTOR MEMORY

(75) Inventors: Robert Kaiser, Kaufering; Florian Schamberger, Bad Reichenhall, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/483,738

(22) Filed: Jan. 14, 2000

(30) Foreign Application Priority Data

Jan. 14, 1999 (DE) .............................. 199 01 206

(51) Int. Cl.$^7$ ...................................... G11C 7/00
(52) U.S. Cl. .......................... 365/200; 365/210
(58) Field of Search ................... 365/200, 201, 365/210, 239

(56) References Cited

U.S. PATENT DOCUMENTS

| | | | |
|---|---|---|---|
| 4,922,134 | * 5/1990 | Hoffmann et al. | 307/441 |
| 5,206,583 | 4/1993 | Dawson et al. . | |
| 5,410,687 | 4/1995 | Fujisaki et al. . | |
| 5,519,657 | * 5/1996 | Arimoto et al. | 365/200 |
| 5,689,465 | * 11/1997 | Sukegawa et al. | 365/200 |
| 5,920,515 | * 7/1999 | Shaik et al. | 365/200 |
| 6,021,512 | * 2/2000 | Lattimore et al. | 714/710 |

FOREIGN PATENT DOCUMENTS 196 12 407
A1  11/1996 (DE) .

198 38 861
A1  3/2000 (DE) .

OTHER PUBLICATIONS

Internaional Publication WO 00/13087 (Schamberger et al.), dated Mar. 9, 2000.

Unpublished German Patent Application DE 19838 861.6.

John R. Day; "A Fault–Driven Comprehensive Redundancy Algorithm", International Test Conference 1984, XP–000744056, pp. 35–44.

Fabrizio Lombardi et al.: "Approaches For The Repair of VLSI/WSI RRAMs By Row/Column Deletion", XP–000619023.

\* cited by examiner

*Primary Examiner*—David Nelms
*Assistant Examiner*—Thong Le
(74) *Attorney, Agent, or Firm*—Herbert L. Lerner; Laurence A. Greenberg; Werner H. Stemer

(57) ABSTRACT

At least two different submethods for repairing defective memory cells are used sequentially. In the submethods, the memory cells are successively tested in each case, and, directly after a defect has been ascertained, the relevant row line or the relevant column line is replaced by programming one of the redundant lines. The submethods differ in terms of their repair strategy. One submethod is called with a defect-signature which terminates the submethod and contains information about the number of checked memory cells and the repair result. Subsequently, depending on the defect-signature of the preceding submethod, another submethod is called, which initially does not cancel, partially cancels, or entirely cancels, the programming that has been performed.

13 Claims, 7 Drawing Sheets

METHOD FOR REPAIRING DEFECTIVE MEMORY CELLS OF AN INTEGRATED SEMICONDUCTOR MEMORY

BACKGROUND OF THE INVENTION

FIELD OF THE INVENTION

The invention relates to a method for repairing defective memory cells of an integrated semiconductor memory.

The U.S. Pat. No. 5,410,687 describes such a method. Individual memory cells of a memory are tested, wherein the memory cells are situated at crossover points of rows and columns. For each column and each row, the memory has a defect counter in which the defects that are detected for this column or row, respectively, are summed. Once all of the memory cells have been tested, defective memory cells are repaired through the use of redundant column and row lines on the basis of the information items stored in the defect counters. The defect counters required for its implementation require a relatively large amount of space.

The U.S. Pat. No. 5,206,583 describes an integrated circuit which has fuses for a permanent programming of redundant elements. The integrated circuit furthermore has reversibly programmable elements in the form of latches, which are connected in parallel with the fuses and serve, for test purposes, for reversibly programming the redundant elements.

SUMMARY OF THE INVENTION

It is accordingly an object of the invention to provide a method for repairing defective memory cells of an integrated memory which overcomes the above-mentioned disadvantages of the heretofore-known methods of this general type and for which the necessary hardware components require the smallest possible area.

With the foregoing and other objects in view there is provided, in accordance with the invention, a method for repairing defective memory cells connected to respective row lines and respective column lines in an integrated semiconductor memory. The method includes the steps of providing at least two submethods for testing memory cells in an integrated semiconductor memory and repairing defective ones of the memory cells, each of the at least two submethods performing a successive testing of the memory cells and, after ascertaining a defect of a given one of the memory cells and prior to checking a further one of the memory cells, replacing one of a row line and a column line connected to the given one of the memory cells by programming one of a plurality of redundant lines including redundant row lines and redundant column lines, the at least two submethods differing in terms of an order of checking the memory cells and in terms of selecting a given one of the plurality of redundant lines for the purpose of replacing one of the row line and the column line by programming the one of the plurality of redundant lines; calling one of the at least two submethods and terminating the one of the at least two submethods with a defect-signature, the defect-signature containing information about a number of checked memory cells and a number of one of programmed ones of the plurality of redundant lines and remaining ones of the plurality of redundant lines; and subsequently, depending on the defect-signature, calling another one of the at least two submethods, the another one of the at least two submethods initially performing a step selected from the group consisting of entirely canceling, partially canceling, and not canceling the programming of at least one of the plurality of redundant lines.

In accordance with another mode of the invention, at least one of the submethods is called until all of the memory cells have been checked and repaired, or until the integrated semiconductor memory is identified as irreparable.

In accordance with yet another mode of the invention, the defect-signature includes at least one parameter having a value that is changeable during an execution time of the method for repairing defective memory cells.

In accordance with a further mode of the invention, the value of the at least one parameter is transferred to one of the at least two submethods following a currently active one of the at least two submethods.

In accordance with yet a further mode of the invention, the at least two submethods include the steps of programming a given number of the redundant lines including a specific one of the redundant lines for repairing a specific one of the memory cells; subsequently canceling the programming of at least the specific one of the redundant lines in the event of ascertaining a further defect; and programming the specific one of the redundant lines for repairing a defect of one of the memory cells other than the specific one of the memory cells.

In accordance with an added mode of the invention, a first one of the at least two submethods includes the steps of canceling programmings of redundant lines performed during a preceding execution of at least one of the at least two submethods; testing the memory cells for defects in a row by row manner, beginning with a start address; in the event of ascertaining a defect of a currently tested memory cell, replacing a relevant column line by one of the redundant column lines if a number of programmed redundant column lines does not exceed a limit value; in the event of exceeding the limit value, cancelling all programmings of redundant column lines effected on account of defects ascertained in a relevant row line; and replacing the relevant row line by one of the redundant row lines.

In accordance with another mode of the invention, the first one of the at least two submethods is terminated if all of the memory cells have been repaired or, if, after a further defect has been ascertained and the limit value is exceeded, all of the redundant row lines have already been programmed.

In accordance with yet another mode of the invention, the limit value is changed during an execution time of the first one of the at least two submethods.

In accordance with an added mode of the invention, the at least two submethods include a first submethod and a second submethod, and the second submethod includes the steps of testing the memory cells beginning with a start address; after all of the redundant lines have been programmed, canceling the programming of one of the redundant lines, in the event of a further defect being ascertained; subsequently testing the memory cells again, beginning with the start address; reversing the canceling of the programming of the one of the redundant lines, if, during the step of subsequently testing, a defect is ascertained and the defect is located before the further defect in address terms; subsequently, with regard to the programming of another one of the redundant lines, repeating the steps of canceling the programming, testing the memory cells again and reversing the canceling; and repairing the further defect using a redundant line having become free due to the canceling of the programming, if, after the canceling of the programming of one of the redundant lines, no defect located before the further defect in address terms is ascertained during the subsequent testing of the memory cells.

In accordance with another mode of the invention, the second submethod is terminated if all of the memory cells have been repaired or, if, after the further defect has been ascertained, the successive canceling of the programming of all of the redundant lines does not allow a repair of all of the defects identified.

The column lines may for example be bit lines and the row lines may for example be word lines of the integrated memory. In other exemplary embodiments, the column lines may also be word lines and the row lines may also be bit lines of the memory.

The method according to the invention has the advantage that defect counters for each column line and row line to be tested are not necessary since a defect is repaired in each case after it has been ascertained. In order to achieve more extensive optimization of the repair to be carried out, the method comprises at least two different submethods or partial methods. The submethods are configured differently and called or invoked successively, with the result that the respective specific advantages of the submethods contribute, in combination, to an improved result of the repair to be carried out, compared with repair results that would be attainable by a single submethod being called or invoked individually. An improved repair result may, for example, be manifested by the fact that the highest possible number of redundant lines remain, which can additionally be used for other purposes, or that a solution for the repair is found which cannot be found by a single submethod.

The submethods differ in terms of the order in which the memory cells are checked, and in terms of which of the redundant lines is programmed for the purpose of replacing the relevant row line or the relevant column line. In addition, a defect-signature which terminates the respective submethod is determined. The defect-signature contains information about the number of checked memory cells and the repair result. Subsequently, depending on the defect-signature of the preceding submethod, another submethod is called, which initially does not cancel, partially cancels, or completely cancels, the programming that has been performed. As a result, it is possible, depending on the repair result of the preceding submethod, to select another submethod, which is better matched, with regard to its repair strategy, to the defect pattern now present and which takes up the repair of the preceding submethod or rejects the latter completely or partially.

The reversible programming of the redundant lines can be effected for example through the use of reversibly programmable elements such as the latches described in U.S. Pat. No. 5,206,583. The repair method according to the invention is distinguished by an extremely low outlay on hardware, with the result that it is particularly suitable for the implementation of a self-test and of a self-repair of the integrated memory to be repaired. This means that all the components required for carrying out the repair method are constituent parts of the integrated memory or are configured with the latter on the same integrated circuit. On the other hand, the method according to the invention can, of course, also be implemented as software or also be carried out by an external tester of the integrated memory.

According to one embodiment of the submethods, as described in the yet unpublished German patent application DE 198 38 861.6, after the programming of a specific number of redundant lines, the programming of at least one of the redundant lines is canceled in the event of a further defect being ascertained. This redundant line is programmed for the repair of a defect of another memory cell. This achieves a degree of optimization of the repair to be carried out within a submethod.

In one embodiment of a first submethod, the memory cells are tested for defects in a row by row manner, and, in each case after a defect of the currently tested memory cell has been ascertained, before a further memory cell is checked, the column line, to which the memory cell for which the defect was ascertained is connected, is replaced by a redundant column line, provided that the number of programmed redundant column lines does not exceed a limit value in the process. In the event of the limit value being exceeded, all programmings of redundant column lines which have been effected on account of defects ascertained in the relevant row line are canceled, and the relevant row line is replaced by one of the redundant row lines.

In this embodiment, therefore, defects that have been identified are repaired in each case perpendicularly to the test direction. Specifically, testing is effected in a row by row manner and replacement is initially effected in a column by column manner. Only if the number of redundant column lines that are already used exceeds the limit value are the preceding programmings at least partially canceled. However, only the programmings of those redundant column lines which have been programmed on account of defects identified in the relevant row line are reversed. Since the relevant row line is subsequently replaced by a redundant row line and the programmings of redundant column lines which have been effected on account of defects identified in previously tested row lines are not canceled, it is the case that, if there are sufficient redundant lines present, all defects that are ascertained are repaired in the manner described within a single test pass of the memory cells.

According to one development of this embodiment of the first submethod, the limit value for the number of redundant column lines to be programmed is altered during the checking process. This enables adaptation to the available number of redundant column lines that have not yet been programmed.

In one embodiment of a second submethod, the memory cells are tested, beginning with a start address. After all of the redundant lines have been programmed, the programming of one of the redundant lines is canceled in the event of a further defect being ascertained. The memory cells are subsequently tested anew, beginning with the start address. If, in the process, a defect is ascertained which is provided before the further defect in address terms, the canceling of the programming of the corresponding redundant line is reversed. In other words, the corresponding redundant line is programmed for the replacement of the same normal line as before the canceling of its programming. The three preceding method steps are subsequently repeated with regard to the canceling of the programming of another of the redundant lines. If, after the canceling of the programming of one of the redundant lines, no defect located before the further defect in address terms is ascertained during the subsequent testing of the memory cells, the further defect is repaired using the redundant line which has become free due to the canceling of its programming.

This embodiment of the second submethod makes it possible to cancel the programming of those redundant lines which repair only defects which have already been ascertained and which, moreover, have already been rectified by other redundant lines. Therefore, these defects remain repaired after the canceling of the programming of the relevant redundant line.

Other features which are considered as characteristic for the invention are set forth in the appended claims.

Although the invention is illustrated and described herein as embodied in a method for repairing defective memory cells of an integrated semiconductor memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
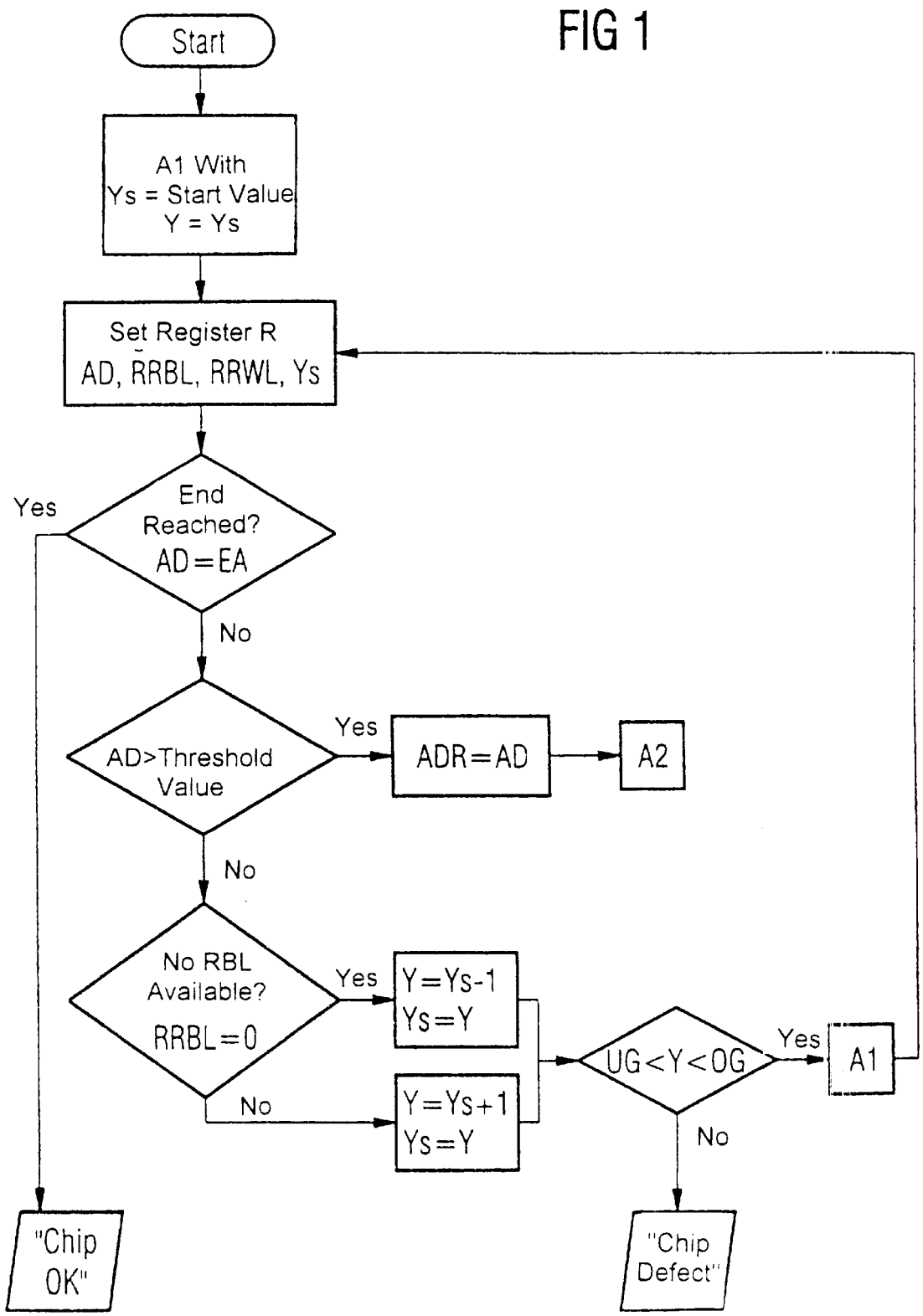
FIG. 1 is a flow diagram of an embodiment of the repair method according to the invention.
Figure 2:
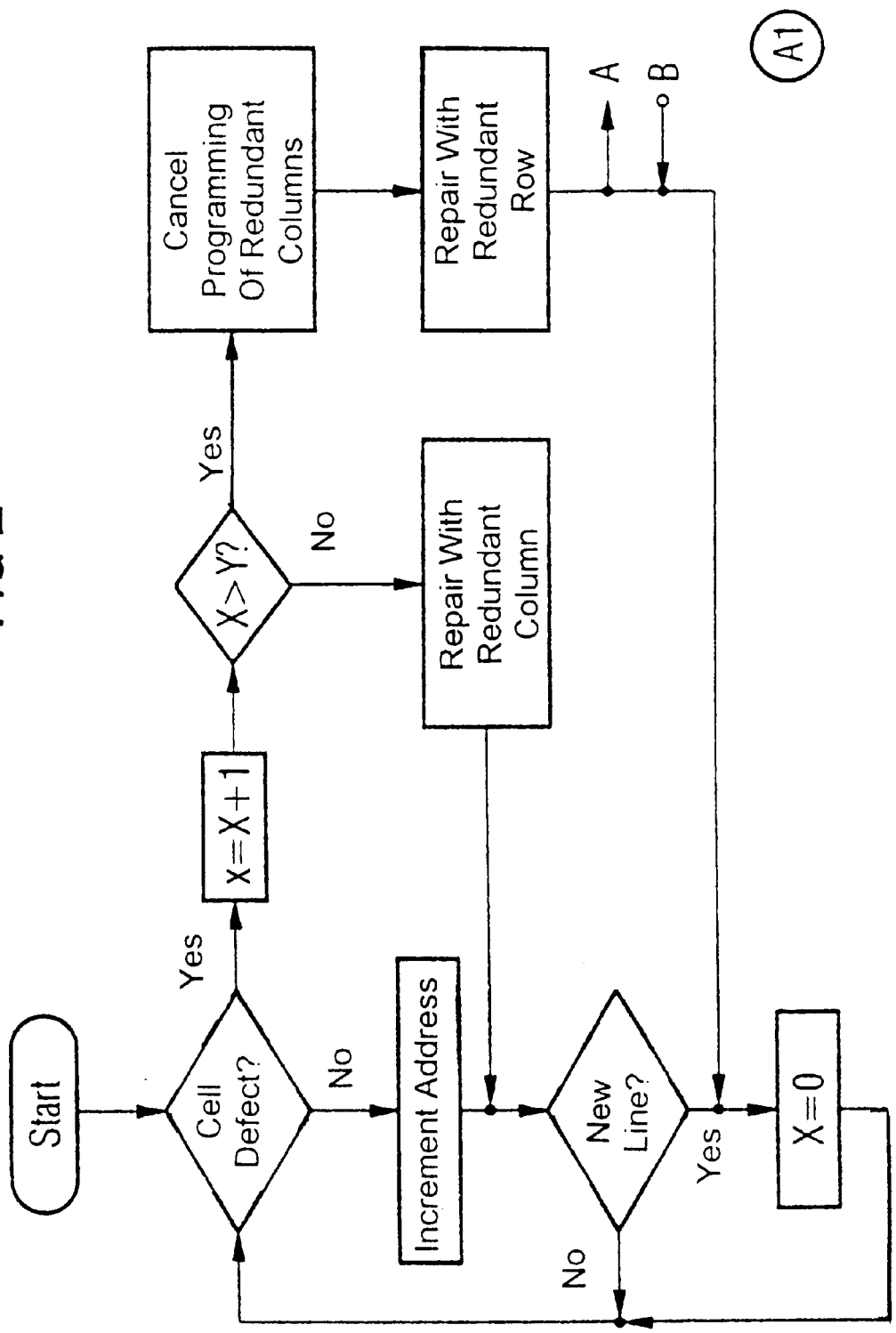
FIG. 2 is a flow diagram of an embodiment of the first submethod.

Referring now to the figures of the drawings in detail and first, particularly, to FIGS. 2–13, the embodiments of the submethods A1 and A2, as described in the German patent application DE 198 38 861.6, will be explained. DE 198 38 861.6 describes a method for repairing defective memory cells of an integrated semiconductor memory, which are connected to a respective row line and a respective column line. The memory cells are successively tested, and, after a defect of the respectively tested memory cell has been ascertained, the relevant row line or the relevant column line is replaced by programming one of the redundant lines. After the programming of a specific number of redundant lines, the programming of at least one of the redundant lines is canceled in the event of a further defect being ascertained. This redundant line is programmed for the repair of a defect of another memory cell. Thus an optimization of the repair to be carried out is achieved as a result.

In the submethod A1, first of all programmings of redundant lines that have been performed in preceding submethods are canceled. In accordance with FIG. 2, the memory cells of the integrated memory are successively tested. In order to test the respectively succeeding memory cell, the address is correspondingly incremented. Each time at the beginning of testing a new row line, a counter X is set to zero. If a defect is identified, the counter X is incremented by one and the reading of the counter X is compared with a limit value Y. The limit value Y applies to the number of maximum permitted column lines which are programmed for the repair in the current row line. Specifically, the memory cells are tested in a row by row manner, whereas, in the event of a defect being ascertained, the repair is carried out in a column by column manner. As long as the counter X does not exceed the limit value Y in the event of a defect being ascertained, the defect is rectified by a redundant column line. However, if the counter X exceeds the limit value Y, the programming of those redundant column lines which have been programmed for the repair of defects identified in the current row line is canceled. The current row line is subsequently repaired by a redundant row line.

It is particularly expedient if the replacing redundant row line is itself checked for defects after the replacement process. For this purpose, the first submethod is continued with the checking of that memory cell of the redundant row line which has the smallest column address. If defects are discovered on the redundant row line, then, as before, first of all a repair is effected by way of the redundant column lines. If the number of the latter exceeds the permissible limit value, their programming is canceled and the redundant row line is replaced by another redundant row line. The checking of the memory cells of a programmed redundant row line can, of course, be omitted if the redundant lines have been tested prior to their programming and only defect-free redundant lines are subsequently used for a repair.

Figure 12:
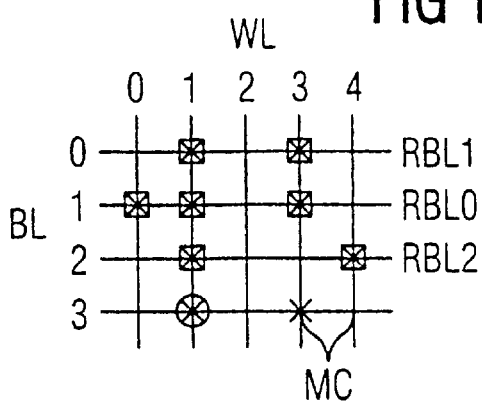
FIGS. 12 and 13 are schematic partial views of an integrated memory and tables illustrating an exemplary embodiment for implementing the submethod illustrated in FIG. 2.
Figure 13:
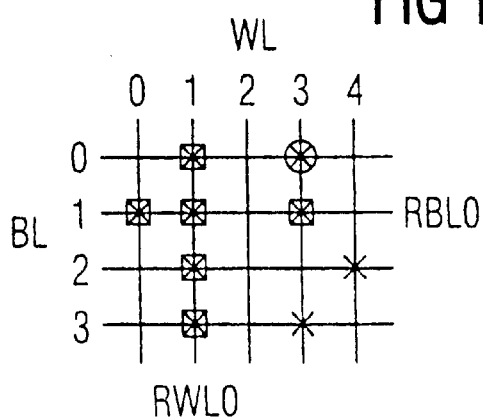

An exemplary embodiment of the embodiment of the first submethod A1 will be described below with reference to FIGS. 12 and 13. In FIG. 12, a memory cell array of the integrated memory is illustrated in the left-hand part and an overview of the redundant lines is illustrated in the right-hand part. FIGS. 12 and 13 and also 5 to 11 use essentially the same mode of illustration, for which reason this will only be discussed once. The memory cells MC of the integrated memory are disposed at crossover points of bit lines BL and word lines WL. The bit lines BL are consecutively numbered from 0 to 3 and the word lines WL from 0 to 4. Defective memory cells MC are marked by crosses. Memory cells MC that have already been repaired by redundant lines are marked by squares. A circle marks the current defect, that is to say the one that has just been ascertained, of one of the memory cells MC. A table which, for illustration purposes, contains all of the available redundant lines of the memory is shown in the right-hand part of FIG. 12. In the case of the exemplary embodiment explained with reference to FIGS. 12 and 13, the memory has two redundant word lines RWL0, RWL1 and three redundant bit lines RBL0, RBL1, RBL2. The table specifies which of these redundant lines has already been programmed for the replacement of one of the normal lines BL, WL. In this case, a zero indicates that the associated redundant line has not yet been programmed, and a one indicates that programming has already been effected.

The left-hand part of FIG. 12 also reveals the manner in which the defective memory cells MC have been repaired. Specifically, the redundant lines RBLi which have been programmed for the replacement of the respective normal bit lines BL are entered on the right of the memory cell array and the redundant word lines RWLi which have been programmed for the replacement of the normal word lines are entered below the memory cell array. In the present case, prior to the state illustrated in FIG. 12, the memory cells MC had already been tested sequentially, beginning with the memory cell address 0,0 (that is to say word line WL0 and bit line BL0), to be precise in the direction of the word lines WL. The memory cell 0,0 has no defects. The memory cell 0,1 was subsequently tested (word line WL0, bit line BL1), and a defect was established in this case. This defect was repaired by the bit line 1 being replaced by the redundant bit line RBL0. The memory cells were subsequently tested further, the defect counter X being reset to 0 at the beginning of the next word line WL1. The defective memory cell 1,0 on the word line WL1 was repaired by the redundant bit line RBL1 and the defect counter X was incremented to the value 1. Since the bit line BL1 has already been replaced by the redundant bit line RBL0, the next defect ascertained is that with the address 1, 2. This defect is repaired by the redundant bit line RBL2. The defect counter X is incremented to 2. The defect of the memory cell 1, 3 is ascertained next. This state is illustrated in FIG. 12. This defect is not repaired by a redundant bit line, since the defect counter X is incremented to three and has thus exceeded the limit value Y, which likewise has the value two. As a consequence of this, the programming of the redundant bit lines RBL1 and RBL2, which have been ascertained on account of the defects ascertained in the current word line WL1 at the addresses 1,0 and 1,2, is canceled. By contrast, the programming of the redundant bit line RBL0, which replaces the normal bit line BL1, is not canceled, since it was not effected on the basis of a defect detected in the current word line WL1. Its programming was effected on account of the defect ascertained in the word line WL0, with the address 0,1. The normal word line WL1 is subsequently replaced by the redundant word line RWL0.

FIG. 13 shows this state of the integrated memory. The limit value Y is again fixed at the value 2, since two of the redundant bit lines RBLi are again available for programming. These are the redundant bit lines RBL1 and RBL2, whose programming, as just described, has been canceled. The memory cells are continually tested, so that the defect with the address 3,0 is ascertained next. This defect is again repaired by one of the redundant bit lines RBLi. The first submethod is continued in an analogous manner, the programming of some of the redundant bit lines being canceled whenever the reading of the counter X exceeds the limit value Y.

Figure 3:
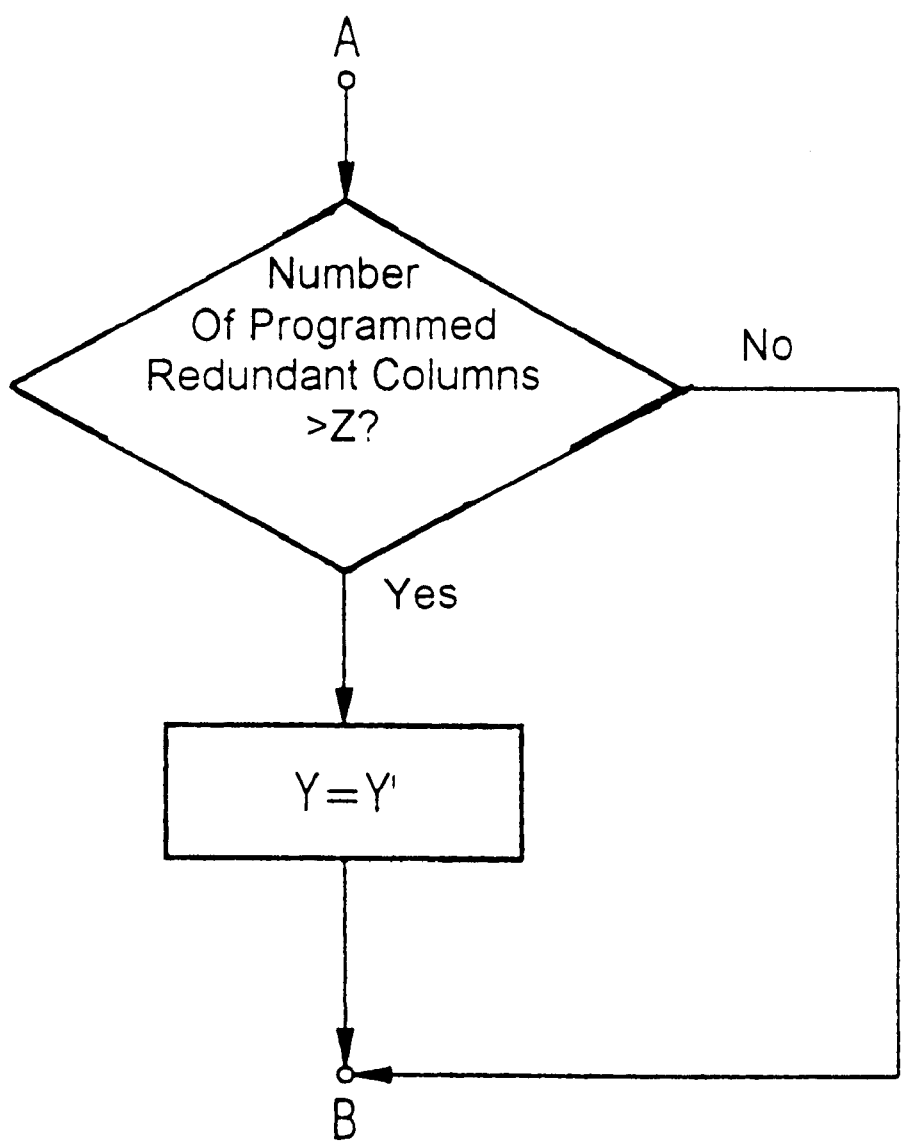
FIG. 3 is a supplemental flow diagram for the flow diagram of FIG. 2.

If the number of available redundant bit lines RBLi which have not yet been programmed changes, the limit value Y is fixed anew at the beginning of the testing of the next word line WLi. FIG. 3 shows a supplementation of the flow diagram of FIG. 2 at the location designated by A and B, according to which the limit value Y is adapted, for example, when the number of redundant column lines already programmed exceeds a value Z. In this case, only a relatively small number of redundant column lines are available for programming, with the result that the limit value Y has to be decremented to a value Y'.

The first submethod A1 is ended if all of the defective memory cells MC have been repaired or if, after a further defect is established, in the event of the limit value Y being exceeded, all of the redundant row lines RWL have already been programmed.

Figure 4:
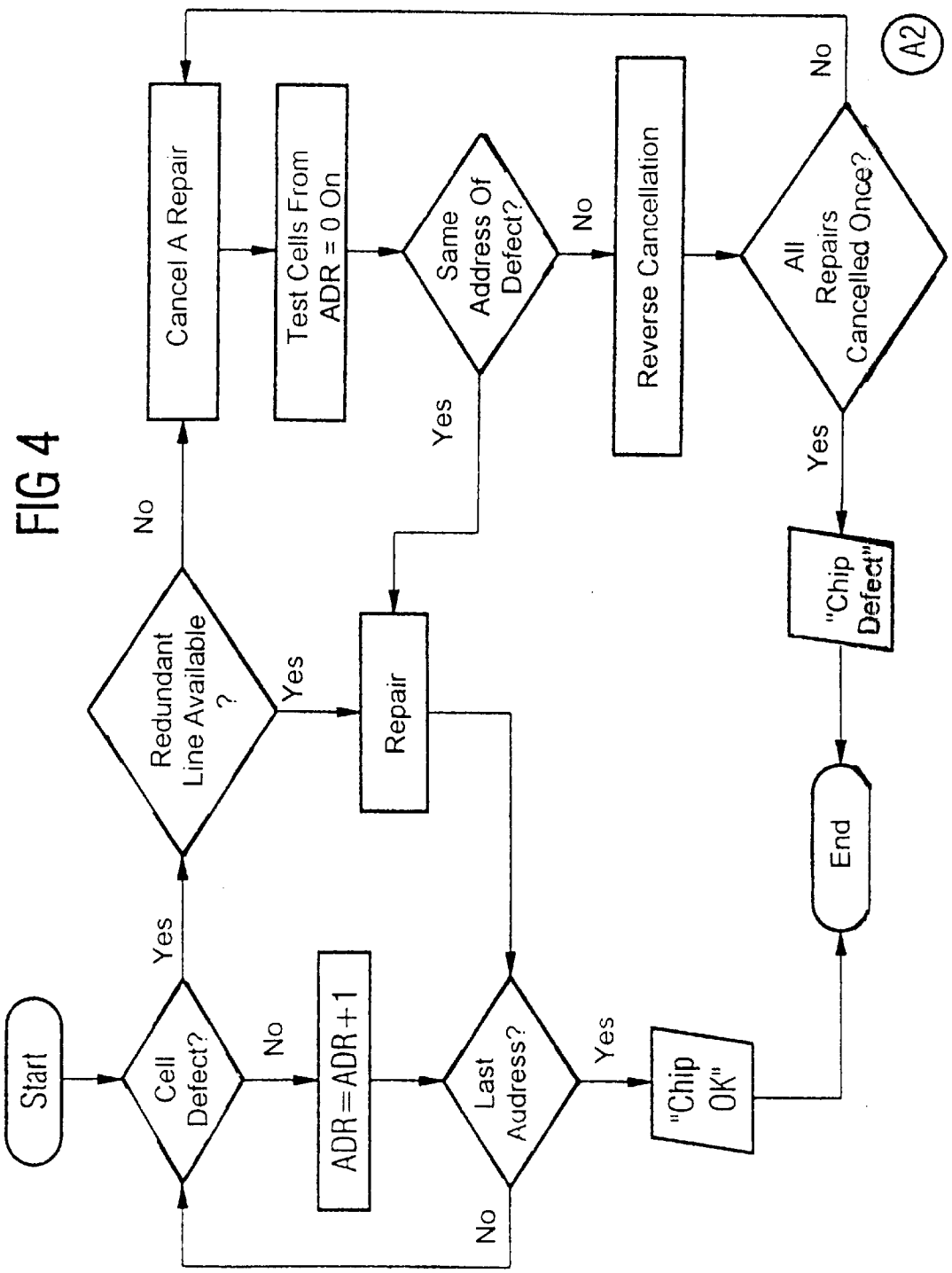
FIG. 4 is a flow diagram of an embodiment of the second submethod.
Figure 5:
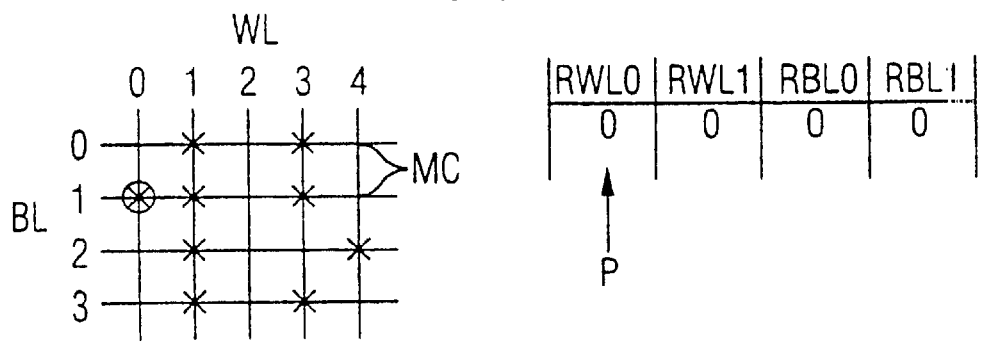
FIGS. 5 to 11 are schematic partial views of an integrated memory and tables illustrating an exemplary embodiment for implementing the submethod illustrated in FIG. 4.

FIG. 4 shows the flow diagram for an embodiment of the second submethod A2. The memory cells are tested sequentially, beginning with an address ADR. As long as a defect is not ascertained, the address is continually incremented. If the last address has been reached and there is no defect remaining as irreparable, the integrated circuit is deemed to be repaired and the repair method is ended. As soon as a defective memory cell has been ascertained, then, as long as a redundant line is still available for programming, the defect is repaired by the replacement of the relevant row line or of the relevant column line by a corresponding redundant line. However, if all of the redundant lines have already been programmed, the programming of one of the redundant lines is canceled, with the result that the original, normal column or row line, respectively, is addressed again. All of the memory cells are subsequently tested sequentially anew, beginning with the start address ADR. If a defect which, in address terms, is located before the defect that was ascertained last, is not ascertained in the process, it is certain that the defects which have been repaired by the redundant line whose programming has been canceled have also been repaired by other redundant lines (that is to say multiply). Therefore, the redundant line that has become free can be used for the repair of the defect that was ascertained last. However, if a defect is ascertained with a smaller address than that of the defect that was ascertained last, the cancellation of the programming of the relevant redundant line is reversed. This means that it is programmed anew in exactly the same way as was the case before the cancellation of its programming. This redundant line cannot, therefore, be used for a repair of the current defect. Instead, the programming of another of the redundant lines is canceled and the cells are tested anew. This method is repeated until the cancellation of the programming of one of the redundant lines leads to success or until the programming of all the redundant lines has been successively canceled without the current defect having been able to be repaired. In the last-mentioned case, the chip is identified as defective and the second submethod A2 is ended.

A concrete exemplary embodiment of the second submethod A2 illustrated in FIG. 4 is outlined below with reference to FIGS. 5 to 11. In this exemplary embodiment, the integrated memory has two redundant word lines RWL0, RWL1 and two redundant bit lines RBL0, RBL1. Defective memory cells MC are again identified by crosses in the memory cell array. The circle identifies the current defect that has been ascertained. Defects that have been identified are repaired in this exemplary embodiment by the programming of the redundant lines in the order which is illustrated in the table in the right-hand part of the figures. In order to repair the first defect with address 0, 1 (word line WL0, bit line BL1), therefore, the redundant word line RWL0 is used. A pointer P points to the redundant line that is to be used next in each case.

Figure 6:
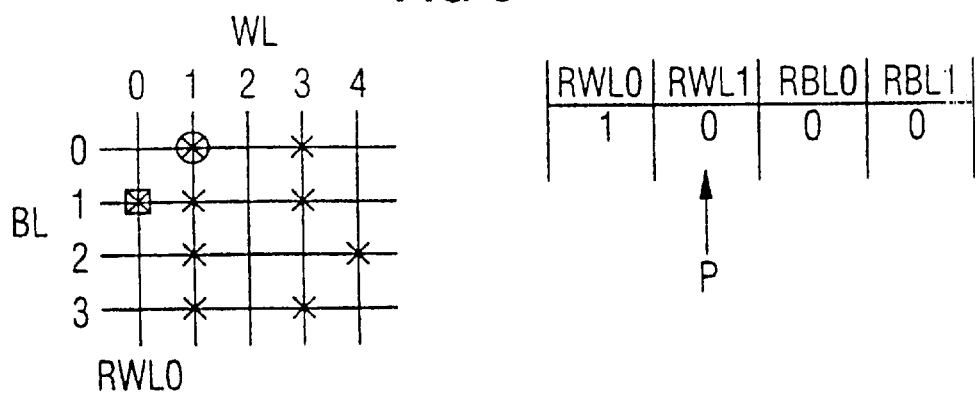
Figure 7:
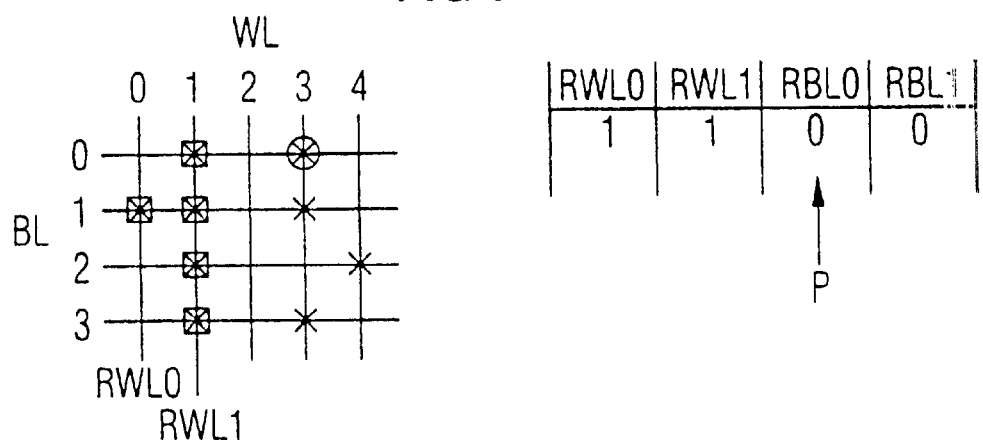

FIG. 6 shows the integrated memory after the word line WL0 has been replaced, in address terms, by the redundant word line RBL0. The programming of the redundant word line RWL0 that has been effected is identified by a 1 in the table. The pointer P points to the redundant line RWL1 that is to be programmed next. The testing of the memory cells is continued sequentially and the defect of the memory cell 1,0 is ascertained next. In accordance with FIG. 7, this defect is repaired by programming the redundant word line RWL1. The other defects on the word line WL1 are also repaired automatically in the process, without the defects having to be tested. It is assumed in this case that the respective programmed redundant lines are free from defects. This can be ascertained through the use of a test carried out prior to their programming. Only the redundant lines which are ascertained as free from defects in the process are used for a repair.

Figure 8:
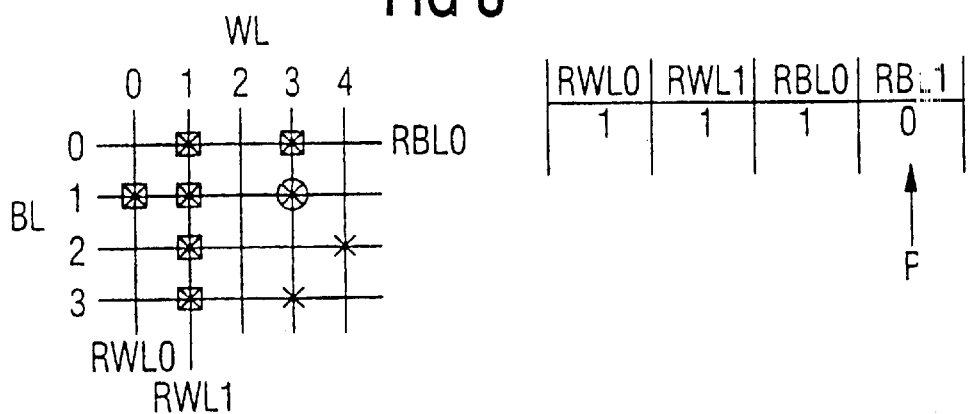
Figure 9:
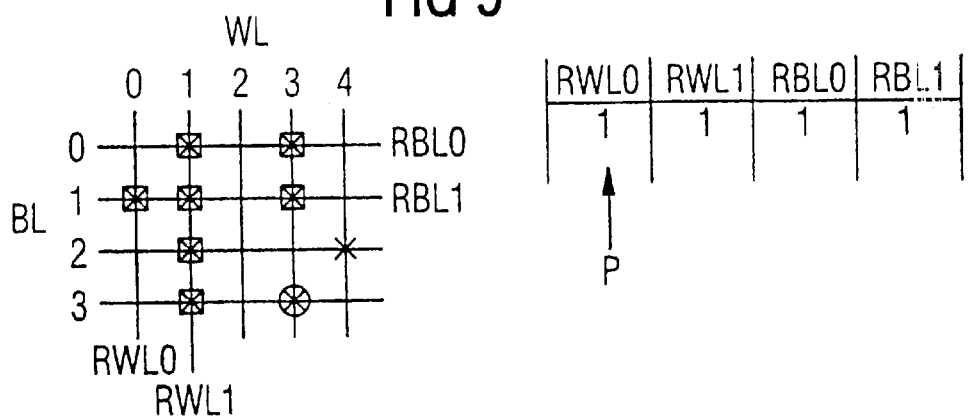

Since the next word line WL2 does not have a defect, the next defect that is ascertained is that with the address 3,0. The pointer P points to the third redundant line RBL0 in the meantime, with the result that the current defect is replaced by the redundant bit line RBL0. This is illustrated in FIG. 8. In accordance with FIG. 9, the next defect, with the address 3,1, is replaced by the redundant bit line RBL1

Figure 10:
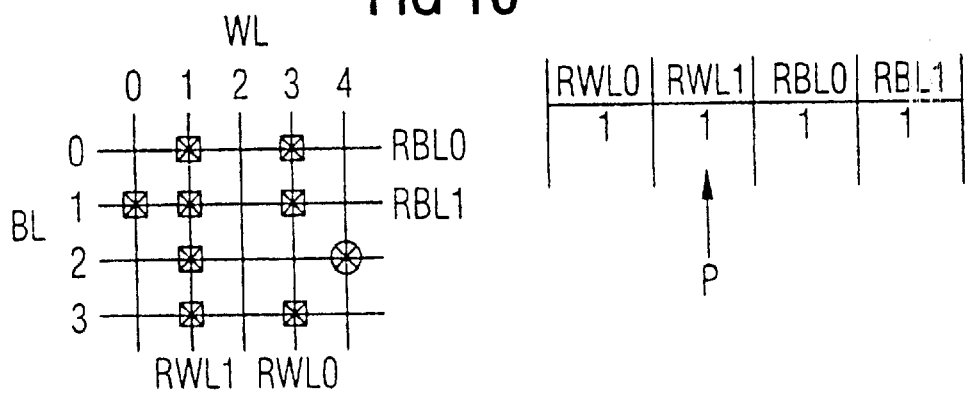

The next defect that is ascertained, with the address 3,3, cannot then be repaired in a straightforward manner, since all of the redundant lines have already been programmed and the pointer P again points to the first redundant line RWL0. In this exemplary embodiment, the programming of that redundant line which is pointed to by the pointer P (this is the redundant line RBL0 that was programmed first) is then canceled. Since the sole defect repaired hitherto by the redundant word line RWL0 is that with the address 0, 1 and, moreover, this defect has also been rectified by the programming of the redundant bit line RBL1, a defect which, in address terms, is provided before the current defect with the address 3,3 is not ascertained during the subsequent test of all of the memory cells. Therefore, the redundant word line RWL0 that has become free due to the cancellation of its programming is used for the repair of the defect of the memory cell 3,3. This state is illustrated in FIG. 10. The pointer P advances to the next redundant line. The memory test is continued with the memory cells MC that have not yet been tested, and the defect with address 4, 2 is ascertained. The programming of the redundant word line RWL1 which is pointed to by the pointer P is subsequently reversed. The memory cells are tested anew, beginning with the address 0,0, the defect with the address 1,2 being ascertained first. Its address is smaller than the address 4,2 of the current address. Therefore, the cancellation of the programming of the redundant word line RWL1 is reversed again.

Figure 11:
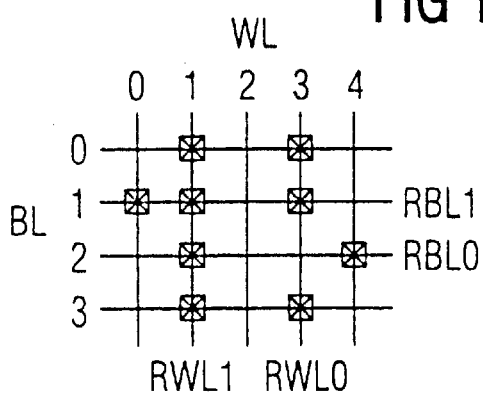

The pointer advances to the next redundant line RBL0 (FIG. 11). Since the current defect, with the address 4,2, has still not been repaired, the programming of this redundant line RBL0 is then canceled. The memory cells are tested anew, beginning with the start address 0,0. A defect which is located before the current defect with the address 4,2 is not ascertained in the process. This is due to the fact that the defects with the addresses 1,0 and 3,0 have already been repaired by the redundant word lines RBL1 and RWL0. Consequently, the redundant bit line RBL0 that has become free can be programmed for the repair of the current defect. This state is shown in FIG. 11. The pointer P advances to the next programmed redundant line RBL1. Finally, the memory cell with the address 4,3 is additionally tested, wherein memory cell does not have a defect. Therefore, the repair method is concluded with a completely repaired integrated memory.

FIG. 1 shows a flow diagram of an embodiment of the repair method according to the invention. This method begins with the calling of the first submethod A1, a start value YS being fixed for the limit value Y. The first submethod A1 ends, as described, if all of the defective memory cells MC have been repaired or if, after a further defect has been ascertained, in the event of the limit value Y being exceeded, all of the redundant row lines are already programmed. This means that a cancellation of all the programmings of redundant column lines RBL, that have been effected on account of defects ascertained in the relevant row line WL, is not possible, since the relevant row line WL cannot be replaced by one of the redundant row lines RWL.

At the end of the first submethod A1, a defect-signature R is created in the form of a register. The latter contains information about the number of checked memory cells MC and the repair results. The number of checked memory cells MC may be determined for example using the address of the memory cell MC that was checked last, or by way of the address of the memory cell MC that is to be checked next. The repair result is manifested in the number of programmed redundant lines RBL, RWL or the number of remaining redundant lines RBL, RWL, designated here as RRBL, RRWL.

The further procedure is determined using the address AD of the memory cell MC that was checked last. If this corresponds to the last memory address EA to be checked, all of the defective memory cells MC have been repaired and the method is ended. Otherwise a test is carried out to see whether the address AD of the memory cell MC that was checked last exceeds a threshold value. In this case, the second submethod A2 is called, the start value of the address ADR acquiring the value of the address AD of the memory cell MC that was checked last. In other words, the second submethod A2 begins with the memory cell MC that was tested last; it does not, therefore, initially cancel the programmings of the previous submethod A1. The method always ends after the second submethod A2 has ended. It it has not been possible to repair all of the memory cells MC, the memory is identified as defective.

If the address AD of the memory cell MC that was checked last remains below the threshold value, the limit value Y for subsequent calling of the first submethod A1 is decremented or incremented by 1, proceeding from the current value YS, depending on whether or not a redundant bit line RBL is no longer available (RRBL=0). The first submethod A1 is subsequently called again with the setting of a new defect-signature R after the submethod has ended, and renewed calling of another submethod and so on, as described above. However, before the first submethod A1 is called, a termination condition must be passed through, which ends the method if the limit value Y is not within a predetermined range of values (UG=lower limit, OG=upper limit). In this case, the memory is identified as defective and the method is ended.

The method is thus continued with the calling of one of the submethods A1, A2 until all of the memory cells MC have been checked and repaired or the memory is identified as irreparable.

The information of the defect-signature R is buffer-stored using one or more parameters. The latter are variable during the execution time of the method. The parameters used here are the address AD of the memory cell MC that was checked last, the number of remaining redundant lines RRBL, RRWL and the respective value YS as starting value for the limit value Y for a subsequent first submethod A1.

As already described, the advantage of the method is the combination of a plurality of different submethods which, for their part, exhibit respective specific strengths in recognizing a specific defect pattern. With the application of the first submethod A1, it is possible, for example, for the limit value Y to be varied to a greater extent at the beginning of the method (the limit value is incremented or decremented by more than one at the corresponding location) and to a lesser extent at the end of the method. Thus, the method makes "tentative steps" or "feels its way" progressively toward a good enough solution (in mathematical terms: one arrives, during the search for a solution, at a "global minimum" and does not end in a "local minimum"). With the second submethod, any double repairs are canceled in the case of corresponding repair progress.

A further advantage of the method compared with a method which calculates a solution possibility with respect to the repair from the totality of defects lies in the fact that the method according to the invention is ended as soon as a solution is found. In other words, only a good enough solution is sought, not the best solution, as a result of which the computation time is optimized.

In addition to or instead of the submethods A1 and A2 described, it is also possible to use other or further submethods which, with regard to their repair strategy, are configured differently from the submethods A1 and A2 described. The strengths of such submethods may lie in the search for a solution with respect to other defect patterns. In order to better utilize the advantages of the respective submethods, it is expedient to transfer the parameters of the defect-signatures R to the respectively succeeding submethod. It is thus possible to take up the preceding repair result. Depending on the parameter values of the respective defect-signature R, at the beginning of the succeeding submethod the preceding repair result is not rejected, is entirely rejected, or else is partially rejected. Furthermore, depending on the type and configuration of the submethods used, it is necessary to correspondingly adapt the defect-signature with regard to its parameters used.

We claim:

1. A method for repairing defective memory cells connected to respective row lines and respective column lines in an integrated semiconductor memory, the method which comprises:

providing at least two submethods for testing memory cells in an integrated semiconductor memory and repairing defective ones of the memory cells, each of the at least two submethods performing a successive testing of the memory cells and, after ascertaining a defect of a given one of the memory cells and prior to check a further one of the memory cells, replacing one of a row line and a column line connected to the given one of the memory cells by programming one of a plurality of redundant lines including redundant row lines and redundant column lines, the at least two submethods differing in terms of an order of checking the memory cells and in terms of selecting a given one of the plurality of redundant lines for the purpose of replacing one of the row line and the column line by programming the one of the plurality of redundant lines;

calling one of the at least two submethods and terminating the one of the at least two submethods with a defect-signature, the defect-signature containing information about a number of checked memory cells and a number of one of programmed ones of the plurality of redundant lines and remaining ones of the plurality of redundant lines; and subsequently, depending on the defect-signature, calling another one of the at least two submethods, the another one of the at least two submethods initially performing a step selected from the group consisting of entirely canceling, partially canceling, and not canceling the programming of at least one of the plurality of redundant lines.

2. The method according to claim 1, which comprises calling at least one of the submethods until all of the memory cells have been checked and repaired.

3. The method according to claim 1, which comprises calling at least one of the submethods until the integrated semiconductor memory is identified as irreparable.

4. The method according to claim 1, wherein the defect-signature includes at least one parameter having a value being changeable during an execution time of the method for repairing defective memory cells.

5. The method according to claim 4, which comprises transferring the value of the at least one parameter to one of the at least two submethods following a currently active one of the at least two submethods.

6. The method according to claim 1, wherein the at least two submethods include the steps of:

programming a given number of the redundant lines including a specific one of the redundant lines for repairing a specific one of the memory cells;

subsequently canceling the programming of at least the specific one of the redundant lines in the event of ascertaining a further defect; and programming the specific one of the redundant lines for repairing a defect of one of the memory cells other than the specific one of the memory cells.

7. The method according to claim 6, wherein a first one of the at least two submethods includes the following steps:

canceling programmings of redundant lines performed during a preceding execution of at least one of the at least two submethods; testing the memory cells for defects in a row by row manner, beginning with a start address;

in the event of ascertaining a defect of a currently tested memory cell, replacing a relevant column line by one of the redundant column lines if a number of programmed redundant column lines does not exceed a limit value;

in the event of exceeding the limit value, cancelling all programmings of redundant column lines effected on account of defects ascertained in a relevant row line; and replacing the relevant row line by one of the redundant row lines.

8. The method according to claim 7, which comprises terminating the first one of the at least two submethods if all of the memory cells have been repaired.

9. The method according to claim 7, which comprises terminating the first one of the at least two submethods if, after a further defect has been ascertained and the limit value is exceeded, all of the redundant row lines have already been programmed.

10. The method according to claim 7, which comprises changing the limit value during an execution time of the first one of the at least two submethods.

11. The method according to claim 1, wherein the at least two submethods include a first submethod and a second submethod, the second submethod includes the following steps:

testing the memory cells beginning with a start address;

after all of the redundant lines have been programmed, canceling the programming of one of the redundant lines, in the event of a further defect being ascertained;

subsequently testing the memory cells again, beginning with the start address;

reversing the canceling of the programming of the one of the redundant lines, if, during the step of subsequently testing, a defect is ascertained and the defect is located before the further defect in address terms;

subsequently, with regard to the programming of another one of the redundant lines, repeating the steps of canceling the programming, testing the memory cells again and reversing the canceling; and repairing the further defect using a redundant line having become free due to the canceling of the programming, if, after the canceling of the programming of one of the redundant lines, no defect located before the further defect in address terms is ascertained during the subsequent testing of the memory cells.

12. The method according to claim 11, which comprises terminating the second submethod if all of the memory cells have been repaired.

13. The method according to claim 11, which comprises terminating the second submethod, if, after the further defect has been ascertained, the successive canceling of the programming of all of the redundant lines does not allow a repair of all of the defects identified.

* * * * *